(12) United States Patent
Su

(10) Patent No.: US 9,508,960 B2
(45) Date of Patent: Nov. 29, 2016

(54) METHOD FOR PACKAGING DISPLAY DEVICE AND APPARATUS THEREFOR

(71) Applicant: EverDisplay Optronics (Shanghai) Limited, Shanghai (CN)

(72) Inventor: Baowei Su, Shanghai (CN)

(73) Assignee: EverDisplay Optronics (Shanghai) Limited, Shanghai (CN)

(*) Notice: Subject to any disclaimer, the term of this patent is extended or adjusted under 35 U.S.C. 154(b) by 0 days.

(21) Appl. No.: 13/954,211

(22) Filed: Jul. 30, 2013

(65) Prior Publication Data
US 2014/0322827 A1 Oct. 30, 2014

(51) Int. Cl.
*H01L 51/52* (2006.01)
*H01L 51/56* (2006.01)
*H01L 27/32* (2006.01)

(52) U.S. Cl.
CPC .......... *H01L 51/56* (2013.01); *H01L 27/3244* (2013.01); *H01L 51/5237* (2013.01); *H01L 51/5246* (2013.01)

(58) Field of Classification Search
CPC .......... H01L 51/5246; H01L 51/5237; H01L 51/56; H01L 27/3244
USPC .......................................... 438/3, 26, 22, 28
See application file for complete search history.

(56) References Cited

U.S. PATENT DOCUMENTS 5,811,682 A * 9/1998 Ohtani et al. ................ 73/643
8,314,551 B2 * 11/2012 Song et al. ................. 313/512
2007/0120468 A1 * 5/2007 Lee et al. .................... 313/504
2009/0195147 A1 8/2009 Song et al.
2009/0203283 A1 * 8/2009 Gentile ......................... 445/25

FOREIGN PATENT DOCUMENTS

| CN | 102450098 A | 5/2012 |
|---|---|---|
| TW | 200901532 A | 1/2009 |
| TW | 201002127 A | 1/2010 |

OTHER PUBLICATIONS

"First Office Action" issued by the State Intellectual Property Office of the People's Republic of China on Feb. 16, 2015 for Application No. CN 201310153440.6.
Office Action issued on Jul. 29, 2015 by the TW Office.

* cited by examiner

*Primary Examiner* — Michael Trinh
(74) *Attorney, Agent, or Firm* — Yunling Ren; Eaton & Van Winkle

(57) ABSTRACT

The present application provides a method for packaging a display device and an apparatus therefor. The method includes: providing a display device, a platform, a laser beam and a magnetic mechanism; wherein the display device includes a light emitting element, the light emitting element includes at least one effective light emitting region thereon and is prepared on an upper surface of a glass substrate, the glass substrate is bonded to a glass cover plate via a sealing adhesive layer; the display device is placed on the platform; the laser beam penetrates the glass cover plate and focuses on the sealing adhesive layer to sinter the sealing adhesive layer; and the magnetic mechanism clamps the glass cover plate and the glass substrate from top to bottom and applies a uniform pressing force on the effective light emitting region of the display device.

9 Claims, 9 Drawing Sheets

S101 — Providing a display device, wherein the display device includes a light emitting element which includes at least one effective light emitting region thereon; the light emitting element is prepared on an upper surface of a glass substrate which is bonded to a glass cover plate via a sealing adhesive layer; the sealing adhesive layer includes a first sealing adhesive and a second sealing adhesive; the first sealing adhesive is formed at a border junction between the glass substrate and the glass cover plate; the second sealing adhesive is formed at other junctions between the glass substrate and the glass cover plate; the glass substrate and the glass cover plate are pressed in vacuum.

S102 — Providing a platform and placing the display device on the platform

S103 — Providing a laser beam which penetrates the glass cover plate and focuses on the sealing adhesive layer to sinter the sealing adhesive layer S104 — Providing a magnetic mechanism which clamps the glass cover plate and the glass substrate from top to bottom and applies a uniform pressing force on the effective light emitting region of the display device

Fig.5

METHOD FOR PACKAGING DISPLAY DEVICE AND APPARATUS THEREFOR

CROSS REFERENCE TO RELATED APPLICATIONS

The present application claims priority under 35 U.S.C. §119 to Chinese Patent Application No. 201310153440.6, filed on Apr. 27, 2013, the entire contents of which are incorporated herein by reference.

TECHNICAL FIELD

The present application relates to the field of packaging a display device, in particular to a method for packaging an AMOLED display device using laser sintering of frit and an apparatus therefor.

BACKGROUND

An AMOLED panel represents an Active Matrix Organic Light Emitting Diode panel. Compared with conventional liquid crystal panels, the AMOLED panel has features such as a quicker response speed, a higher contrast ratio and a wider viewing angle.

One of packaging technologies for the AMOLED panel is to adhere a substrate to a cover plate by using laser sintering of frit. By using water blocking and oxygen blocking characteristics of the frit equivalent to those of glass, it can be guaranteed that the AMOLED panel may arrive at a lifespan up to 100,000 hours or longer.

Specifically, such packaging manner using laser sintering of frit is implemented by the following steps. A frit paste (a well-known packaging material) is attached onto a surface of glass by screen printing or nozzle coating methods in accordance with designed patterns, and then a high temperature sintering is performed to solidify the frit on the surface of glass and to make the surface of the frit flat. Next, ultraviolet (UV) curing adhesive (a well-known packaging material) applying is performed at edges of the glass or outside the frit patterns using a UV curing adhesive, and then the glass is sent to a vacuum pressing machine after completion of the UV curing adhesive applying to complete alignment and pressing actions with the substrate under a vacuum state. After the solidification of the UV curing adhesive, a closed space between the substrate and the cover plate is guaranteed. At this time, the substrate contacts tightly with the surface of the frit by the function of the vacuum. After pressing and solidification, the substrate and the cover plate are sent to a laser sintering machine. The viscosity of the frit is decreased after laser heating, and meanwhile the substrate continues to sink into the surface of the low viscosity frit under the function of the vacuum pressing force to make the contact surface enlarge and to adhere the substrate with the cover plate, thereby completing the laser sintering of the whole patterns.

FIG. 1 illustratively shows a schematic diagram of an ideal state of a packaging method using laser sintering of frit in conventional technologies. As shown in FIG. 1, reference sign 11 indicates a cover plate, reference sign 12 indicates a substrate, reference sign 13 indicates a UV curing adhesive, and reference sign 14 indicates a frit paste. When the frit paste 14 is laser-sintered, the frit paste 14 obtains energies from the laser and its viscosity is decreased. The frit paste 14 needs to be adhered to the substrate 12 within 1 to 2 seconds, and it is needed to guarantee that, before laser sintering, the substrate 12 and the surface of the frit contact tightly and a gap therebetween needs to be less than 0.1 μm. A conventional solution to the problem of the gap between the surface of the frit paste 14 and the substrate 12 is to use vacuum pressing method when packaging and pressing the substrate 12 and the cover plate 11 so as to always maintain a vacuum degree of equal to or greater than 20 kPa, which causes the substrate 12 to contact more tightly with the surface of the frit so as to meet the requirements of the gap when laser sintering is performed. A method for increasing the degree that the substrate tightly contacts with the surface of the frit is to directly increase the vacuum degree between the substrate and the cover plate.

FIG. 2 illustratively shows a schematic diagram of an actual state of a packaging method using laser sintering of frit in conventional technologies. As shown in FIG. 2, reference sign 11 indicate a cover plate, reference sign 12 indicates a substrate, reference sign 13 indicates a UV curing adhesive, and reference sign 14 indicates a frit paste. Only increasing the vacuum degree between the substrate and the cover plate will bring adverse impacts and will influence other packaging effects, and the most serious is deformation of the substrate 12 and the cover plate 11, which will leads to a Newton's Ring phenomenon. The higher the vacuum degree between the substrate 12 and the cover plate 11, the more serious the Newton's Ring phenomenon will be, and the Newton's Ring phenomenon is not allowed for an AMOLED device.

Thus, defects of the existing methods lie in the following aspects. When laser sintering is performed, the substrate 12 maintains tight contact with the surface of the frit paste 14 by the function of the vacuum pressing force. If there are defects in surface flatness of the frit paste 14, a higher vacuum pressing force is needed to make up for such defects. However, in the method for obtaining a higher vacuum pressing force, when the substrate 12 and the cover plate 11 are pressed in vacuum, the vacuum degree is needed to be increased to guarantee high vacuum in the gap between the pressed substrate 12 and the cover plate 11, but doing this is prone to cause deformation of the substrate 12 and the cover plate 11, and thereby to produce the Newton's Ring phenomenon.

In order to address the above problem, FIG. 3 illustratively shows a schematic diagram of use of supporting spacers 15 in a packaging method using laser sintering of frit in conventional technologies. As shown in FIG. 3, reference sign 11 indicates a cover plate, reference sign 12 indicates a substrate, reference sign 13 indicates a UV curing adhesive, reference sign 14 indicates a frit paste, and reference sign 15 indicates supporting spacers. With the increase of the vacuum degree, the substrate 12 and the cover plate 11 suffer from the vacuum pressing force and are deformed more seriously, which thereby causes the Newton's Ring phenomenon more serious. As to this problem, the existing method is to produce a plurality of supporting spacers 15 on the substrate (A photo spacer is usually a substance which is disposed between an upper color panel and a lower TFT panel of a TFT-LCD for keeping a certain distance, i.e., playing a supporting function; in addition, the photo spacer may make thickness distribution of the liquid crystal uniform to prevent defects of blurring in image displaying due to nonuniform thickness distribution of the liquid crystal; its advantages include high sensibility, wide engineering margin, relative high mechanical characteristic, chemical resistance, high adhesiveness and wide application range) to support the substrate and the cover plate, thereby reducing the deformation of the substrate and the cover plate. This method increases process difficulties and manufacturing and producing costs, and meanwhile puts forward a challenge to the strength of the supporting spacers 15.

It can be seen that, in the existing packaging method using a frit paste, when laser sintering is performed, since the force applied on the substrate and the cover plate is not uniform, the substrate and the cover plate are prone to be deformed, which results in the Newton's Ring phenomenon and thereby influences the yield of products. In addition, even if the supporting spacers 15 are used, the supporting spacers 15 can only alleviate the non-uniformity of the force applied on the substrate and the cover plate, but still cannot completely address the problem of non-uniformity of the force applied on the substrate and the cover plate, and production costs and process steps are increased.

SUMMARY OF THE INVENTION

Aiming at the above defects in the conventional technologies, the present application provides a method for packaging a display device and an apparatus therefor, which are able to address the problems in the conventional technologies to reduce occurrence of a Newton's Ring phenomenon when vacuum pressing is performed, and are able to adjust magnitude of a magnetic force according to an actual state of the substrate and the surface of the frit paste to reduce influences imposed by distance problems on laser sintering, and are further able to reduce or completely remove the use of supporting spacers to reduce production costs and process steps and thereby to increase the yield of the display device.

According to one aspect of the present application, a method for packaging a display device is provided. The method at least includes the following steps: providing a display device, the display device comprising a light emitting element, the light emitting element including at least one effective light emitting region thereon and being prepared on an upper surface of a glass substrate, the glass substrate being bonded to a glass cover plate via a sealing adhesive layer, the sealing adhesive layer comprising a first sealing adhesive and a second sealing adhesive, the first sealing adhesive being formed at a border junction between the glass substrate and the glass cover plate, the second sealing adhesive being formed at other junctions between the glass substrate and the glass cover plate, and the glass substrate and the glass cover plate being pressed in vacuum;

providing a platform and placing the display device on the platform;

providing a laser beam penetrating the glass cover plate and focusing on the sealing adhesive layer to sinter the sealing adhesive layer;

further providing a magnetic mechanism which clamps the glass cover plate and the glass substrate from top to bottom and applies a uniform pressing force on the effective light emitting region of the display device.

Preferably, the magnetic mechanism includes a metal mask layer and a magnetic material layer which are in parallel with each other, the metal mask layer is pressed on the glass cover plate, the magnetic material layer is provided below the glass substrate, and the magnetic material layer and the metal mask layer attract each other magnetically.

Preferably, the metal mask layer includes a metal mask, a plurality of hollow grooves are provided on the metal mask, and the hollow grooves are placed over a predetermined sintering line position of the display device.

Preferably, the metal mask layer includes a plurality of metal masks, the metal masks are pressed on respective effective light emitting regions on the display device respectively, and gaps between the metal masks are distributed along a predetermined sintering line position of the display device.

Preferably, the metal mask is an iron-nickel alloy metal material mask.

Preferably, a material of the magnetic material layer is one of a permanent magnetic material and an electromagnetic material.

Preferably, the method further includes providing a buffer layer provided between the magnetic material layer and the glass cover plate.

Preferably, the magnetic mechanism includes two parallel magnetic material layers, in which a first magnetic material layer is pressed on the glass cover plate, a second magnetic material layer is provided below the glass substrate, and the two magnetic material layers attract each other magnetically.

Preferably, a plurality of hollow grooves are provided on the first magnetic material layer, and the hollow grooves are placed over a predetermined sintering line position of the display device.

Preferably, the first magnetic material layer includes a plurality of permanent magnetic materials, the permanent magnetic materials are pressed on respective effective light emitting regions on the display device respectively, and gaps between the permanent magnetic materials are distributed along a predetermined sintering line position of the display device.

Preferably, the first magnetic material layer is one of a sheet-shaped magnetic material, a column-shaped magnetic material and a grain-shaped magnetic material.

Preferably, a material of the magnetic material layers is one of a permanent magnetic material and an electromagnetic material.

Preferably, the method further includes providing a buffer layer provided between the magnetic material layer and the glass cover plate.

Preferably, the second sealing adhesive is formed between the glass substrate and the glass cover plate along a predetermined sintering line position of the display device.

Preferably, the second sealing adhesive is a frit paste.

Preferably, the first sealing adhesive is a UV curing adhesive.

Preferably, the method further includes pressing the glass substrate and the glass cover plate in vacuum.

Preferably, the display device is an organic light emitting diode panel.

Preferably, the display device is an AMOLED panel or a passive matrix organic light emitting diode panel.

According to another aspect of the present application, an apparatus for packaging a display device is provided. The display device includes a light emitting element. The light emitting element is prepared on an upper surface of a glass substrate, the glass substrate is bonded to a glass cover plate via a sealing adhesive layer. The apparatus for packaging the display device includes:

a laser sintering platform on which the display device is placed, and a laser beam of which penetrates the glass cover plate and focuses on the sealing adhesive layer to sinter the sealing adhesive layer;

wherein a magnetic mechanism is further included which clamps the glass cover plate and the glass substrate from top to bottom and applies a uniform pressing force on effective light emitting regions of the display device.

Preferably, the magnetic mechanism includes a metal mask layer and a magnetic material layer which are in parallel with each other, the metal mask layer is pressed on the glass cover plate, the magnetic material layer is provided in or below the laser sintering platform, and the magnetic material layer and the metal mask layer attract each other magnetically.

Preferably, the metal mask layer includes a metal mask, a plurality of hollow grooves are provided on the metal mask, and the hollow grooves are placed over a predetermined sintering line position of the display device.

Preferably, the metal mask layer includes a plurality of metal masks, the metal masks are pressed on respective effective light emitting regions on the display device respectively, and gaps between the metal masks are distributed along a predetermined sintering line position of the display device.

Preferably, the metal mask is an iron-nickel alloy mask.

Preferably, a material of the magnetic material layer is one of a permanent magnetic material and an electromagnetic material.

Preferably, a buffer layer is further provided between the metal mask layer and the glass cover plate.

Preferably, the magnetic mechanism includes two parallel magnetic material layers, in which a first magnetic material layer is pressed on the glass cover plate, a second magnetic material layer is provided in or below the laser sintering platform, and the two magnetic material layers attract each other magnetically.

Preferably, a plurality of hollow grooves are provided on the first magnetic material layer, and the hollow grooves are placed over a predetermined sintering line position of the display device.

Preferably, the first magnetic material layer includes a plurality of permanent magnetic materials, the permanent magnetic materials are pressed on respective effective light emitting regions on the display device respectively, and gaps between the permanent magnetic materials are distributed along a predetermined sintering line position of the display device.

Preferably, the first magnetic material layer is one of a sheet-shaped magnetic material, a column-shaped magnetic material and a grain-shaped magnetic material.

Preferably, a material of the magnetic material layers is one of a permanent magnetic material and an electromagnetic material.

Preferably, a buffer layer is further provided between the magnetic material layer and the glass cover plate.

Preferably, the second sealing adhesive is formed between the glass substrate and the glass cover plate along a predetermined sintering line position of the display device.

Preferably, the second sealing adhesive is a frit paste.

Preferably, the first sealing adhesive is a UV curing adhesive.

Preferably, the display device is an organic light emitting diode panel.

Preferably, the display device is an AMOLED panel or a passive matrix organic light emitting diode panel.

As compared with the conventional technologies, because the use of the above technical solutions, the method for packaging a display device and the apparatus therefor in the present application reduce the occurrence of the Newton's Ring phenomenon when vacuum pressing is performed, and are able to adjust the magnitude of a magnetic force according to an actual state of the substrate and the surface of the frit paste to reduce the influences imposed by distance problems on laser sintering, and are further able to reduce or completely remove the use of the supporting spacers to reduce production costs and process steps and thereby to increase the yield of the display device.

BRIEF DESCRIPTION OF THE DRAWINGS

By reading detailed descriptions below about the non-limited embodiments with reference to the drawings, the above and other features, objectives and advantages of the present invention will become clearer.

FIG. 5 illustratively shows a flow chart of a method for packaging a display device according to the first embodiment of the present application;

DESCRIPTION OF THE EMBODIMENTS

One of ordinary skill in this art will appreciate that they may realize modified embodiments by combining the conventional technologies with the embodiments, and detailed descriptions thereof are omitted. Such modified embodiments do not influence the substantive contents of the present application and detailed descriptions thereof are omitted.

First Embodiment

Figure 1:
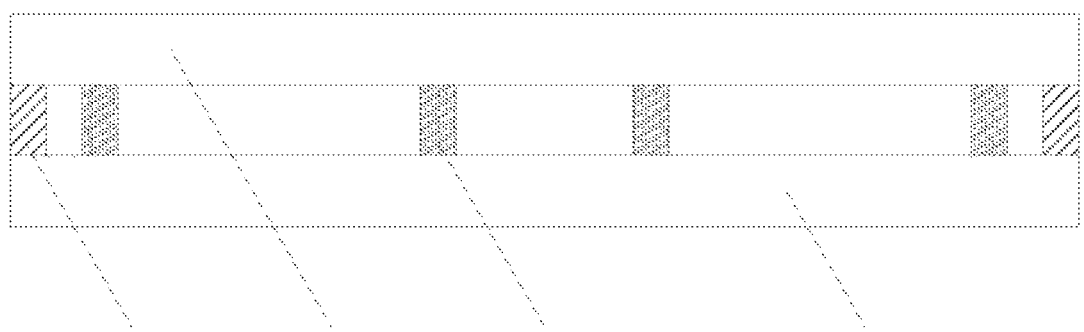
FIG. 1 illustratively shows a schematic diagram of an ideal state of a packaging method using laser sintering of frit in conventional technologies.
Figure 2:
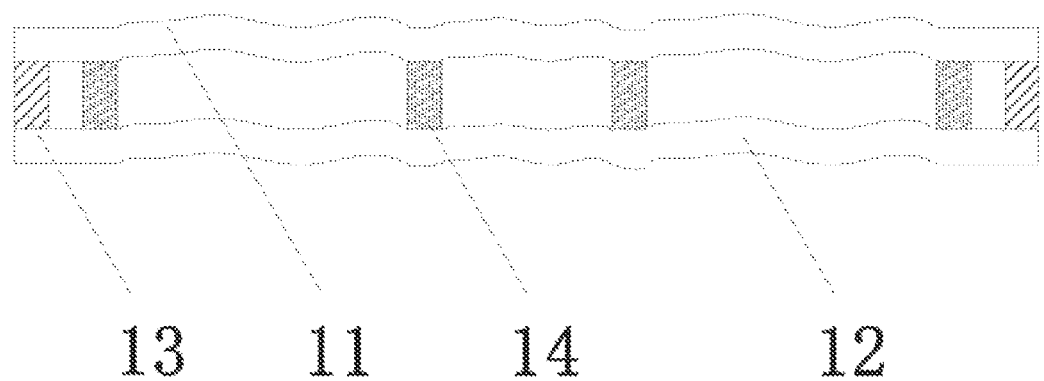
FIG. 2 illustratively shows a schematic diagram of an actual state of a packaging method using laser sintering of frit in conventional technologies.
Figure 3:
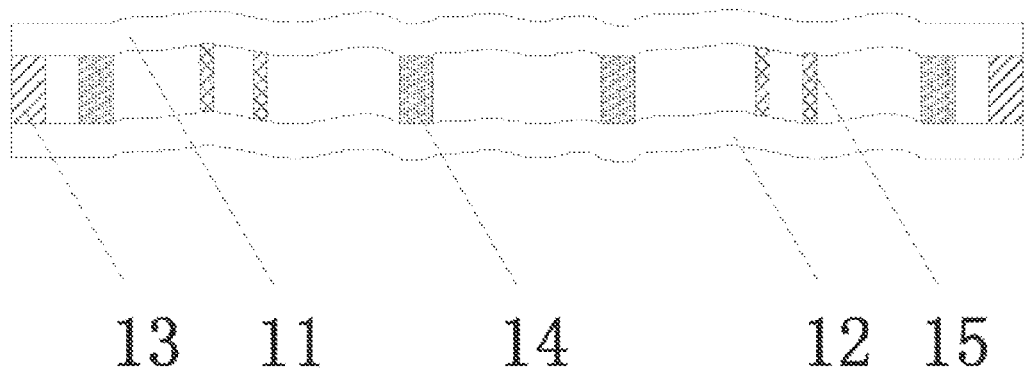
FIG. 3 illustratively shows a schematic diagram of use of supporting spacers in a packaging method using laser sintering of frit in conventional technologies.
Figure 4:
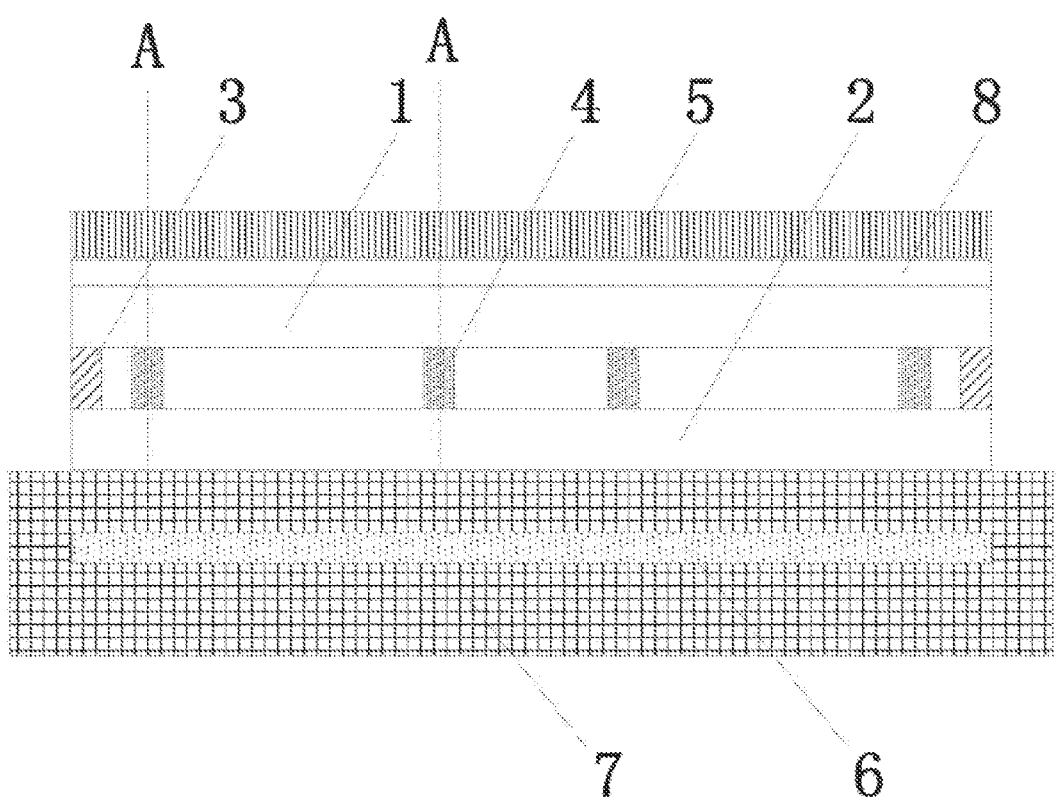
FIG. 4 illustratively shows a schematic diagram of a using state of an apparatus for packaging a display device according to a first embodiment of the present application.

FIG. 4 illustratively shows a schematic diagram of a using state of an apparatus for packaging a display device according to a first embodiment of the present application. As shown in FIG. 4, the present application provides an apparatus for packaging a display device. The display device includes a light emitting element prepared on an upper surface of a glass substrate 2. The glass substrate 2 is bonded to a glass cover plate 1 via a sealing adhesive layer. A second sealing adhesive 4 is formed between the glass substrate 2 and the glass cover plate 1 along a predetermined sintering line position A of the display device. The second sealing adhesive 4 is a frit paste. A first sealing adhesive 3 is a UV curing adhesive. The display device is an organic light emitting diode panel.

The apparatus for packaging the display device includes a laser sintering platform 7 and a magnetic mechanism. The display device is placed on the laser sintering platform 7, and a laser beam of the laser sintering platform 7 penetrates the glass cover plate 1 and focuses on the sealing adhesive layer to sinter the sealing adhesive layer. The magnetic mechanism clamps the glass cover plate 1 and the glass substrate 2 from top to bottom and applies a uniform pressing force on an effective light emitting region of the display device.

The magnetic mechanism includes a metal mask layer 5 and a magnetic material layer 6 which are in parallel with each other. The metal mask layer 5 is pressed on the glass cover plate 1, the magnetic material layer 6 is provided in or below the laser sintering platform 7, and the magnetic material layer 6 and the metal mask layer 5 attract each other magnetically. There is a buffer layer 8 provided between the metal mask layer 5 and the glass cover plate 1. The function of the buffer layer 8 is to prevent the metal mask layer 5 from damaging a surface of the glass cover plate 1.

FIG. 5 illustratively shows a flow chart of a method for packaging a display device according to the first embodiment of the present application. As shown in FIG. 5, the present application provides a method for packaging a display device, which includes the following steps.

At step S101, a display device is provided. The display device includes a light emitting element which includes at least one effective light emitting region thereon. The light emitting element is prepared on an upper surface of the glass substrate 2 which is bonded to the glass cover plate 1 via a sealing adhesive layer. The sealing adhesive layer includes a first sealing adhesive 3 and a second sealing adhesive 4. The first sealing adhesive 3 is formed at a border junction between the glass substrate 2 and the glass cover plate 1. The second sealing adhesive 4 is formed at other junctions between the glass substrate 2 and the glass cover plate 1. The glass substrate 2 and the glass cover plate 1 may be pressed in vacuum according to process requirements.

At step S102, a platform is provided and the display device is placed on the platform.

At step S103, a laser beam is provided which penetrates the glass cover plate 1 and focuses on the sealing adhesive layer to sinter the sealing adhesive layer.

At step S104, a magnetic mechanism is provided which clamps the glass cover plate 1 and the glass substrate 2 from top to bottom and applies a uniform pressing force on the effective light emitting regions of the display device.

The present application makes the glass cover plate 1 and the glass substrate 2 subject to a uniform force mainly by magnetically clamping of two parallel planes, so as to prevent middle portions of the glass cover plate 1 and the glass substrate 2 from contacting with each other and thereby to eliminate the Newton's Ring phenomenon when vacuum pressing is performed.

The magnetic mechanism includes a metal mask layer 5 and a magnetic material layer 6 which are in parallel with each other. The metal mask layer 5 is pressed on the glass cover plate 1 and the magnetic material layer 6 is embedded in the laser sintering platform 7. The magnetic material layer 6 and the metal mask layer 5 attract each other magnetically. A material of the magnetic material layer 6 is one of a permanent magnetic material and an electromagnetic material. The magnetic mechanism is mainly a structure for magnetically clamping planes, and upper or lower portions of the magnetic mechanism may be selected from a metal plate, a plate permanent magnet, an electromagnet, and so on, as long as the upper portion and the lower portion can attract each other magnetically. Even substitutions of the materials of the upper portion and lower portion of the magnetic mechanism still fall into the protection scope of the present invention.

In the present embodiment, the metal mask is an iron-nickel alloy mask. As will be easily appreciated, the metal mask may be other metal materials as well. Even substitutions of the material of the metal mask still fall into the protection scope of the present invention.

A buffer layer 8 is provided between the metal mask layer 5 and the glass cover plate 1. The function of the buffer layer 8 is mainly to prevent the metal mask layer 5 from damaging a surface of the glass cover plate 1. In practical use, in view of conditions such as high heat during the packaging procedure, it is preferable to select a wear-resistant and high-temperature-resistant buffer layer so as to better protect the surface of the glass cover plate 1.

Obviously, under the function of the uniform clamping force formed by the mutual attraction between the metal mask layer 5 and the magnetic material layer 6, during the whole laser sintering procedure, the glass substrate 2 and the glass cover plate 1 are subject to a uniform force, which reduces the occurrence of the Newton's Ring phenomenon. When the vacuum pressing is needed, after the vacuum degree meets the requirements of the glass substrate 2 and the glass cover plate 1, by continuing to be subject to the functions of the metal mask layer 5 and the magnetic material layer 6, the inner surfaces of the glass substrate 2 and the glass cover plate 1 are in parallel with each other or slightly deformed but Newton's Ring phenomenon will not occur, which leads to effects far better than the conventional technologies which provides supporting spacers on several points of the substrate.

Second Embodiment

Figure 6:
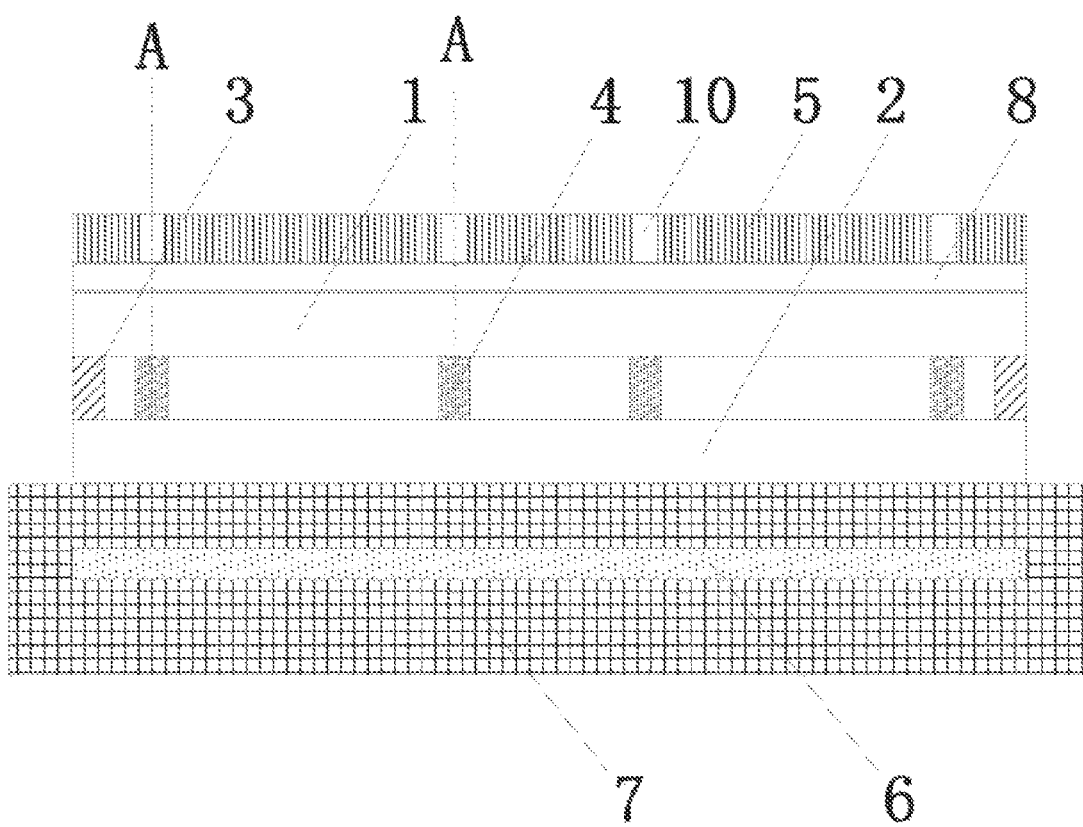
FIG. 6 illustratively shows a schematic diagram of a using state of an apparatus for packaging a display device according to a second embodiment of the present application.

FIG. 6 illustratively shows a schematic diagram of a using state of an apparatus for packaging a display device according to a second embodiment of the present application. As shown in FIG. 6, the present application provides an apparatus for packaging a display device. The display device includes a light emitting element prepared on an upper surface of a glass substrate 2. The glass substrate 2 is bonded to a glass cover plate 1 via a sealing adhesive layer. A second sealing adhesive 4 is formed between the glass substrate 2 and the glass cover plate 1 along a predetermined sintering line position A of the display device. The second sealing adhesive 4 is a frit paste. A first sealing adhesive 3 is a UV curing adhesive. The display device is an organic light emitting diode panel.

The apparatus for packaging the display device includes a laser sintering platform 7 and a magnetic mechanism. The display device is placed on the laser sintering platform 7, and a laser beam of the laser sintering platform 7 penetrates the glass cover plate 1 and focuses on the sealing adhesive layer to sinter the sealing adhesive layer. The magnetic mechanism clamps the glass cover plate 1 and the glass substrate 2 from top to bottom and applies a uniform pressing force on an effective light emitting region of the display device.

The magnetic mechanism includes a metal mask layer 5 and a magnetic material layer 6 which are in parallel with each other. The metal mask layer 5 is pressed on the glass cover plate 1, the magnetic material layer 6 is provided in or below the laser sintering platform 7, and the magnetic material layer 6 and the metal mask layer 5 attract each other magnetically.

Figure 7:
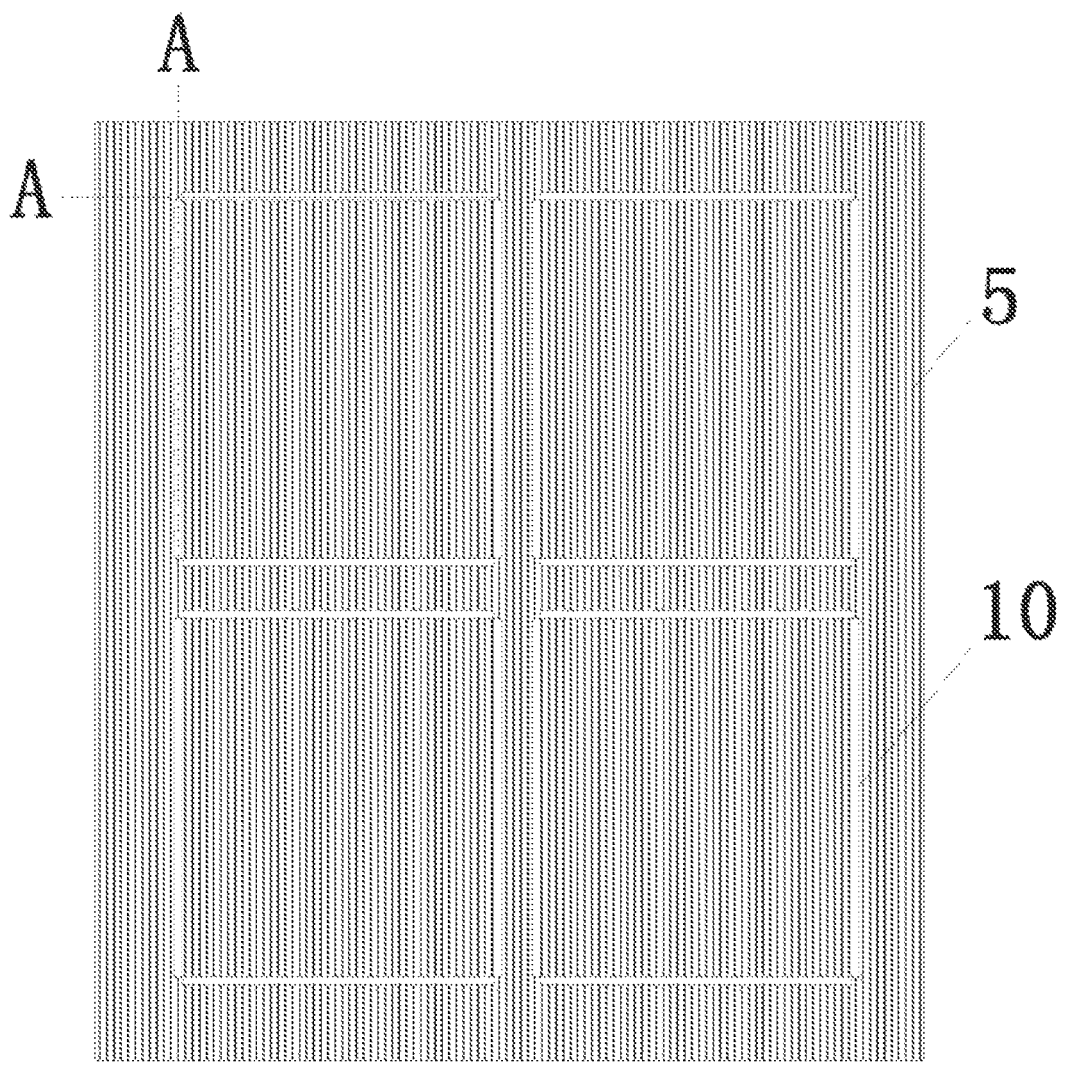
FIG. 7 illustratively shows a top view of a cover plate according to the second embodiment of the present application.

According to actual production and process requirements, the magnetic mechanism in the present application may have many structure variations. FIG. 7 illustratively shows a top view of a cover plate according to the second embodiment of the present application. As shown in FIG. 7, what is different from the first embodiment is that, in this embodiment, the metal mask layer 5 includes a metal mask on which a plurality of hollow grooves 10 are provided. The hollow grooves 10 are placed over the predetermined sintering line position A of the display device. Employing the hollow grooves is mainly to avoid blocking the laser.

In this embodiment, the metal mask is an iron-nickel alloy mask. A material of the magnetic material layer 6 is an electromagnetic material. There is a buffer layer 8 provided between the metal mask layer 5 and a glass cover plate 1. The function of the buffer layer 8 is mainly to prevent the metal mask layer 5 from damaging a surface of the glass cover plate 1. In practical use, in view of conditions such as high heat during the packaging procedure, it is preferable to select a wear-resistant and high-temperature-resistant buffer layer so as to better protect the surface of the glass cover plate 1.

Similarly, under the function of the uniform clamping force formed by the mutual attraction between the metal mask layer 5 with hollow grooves 10 and the magnetic material layer 6, during the whole laser sintering procedure, the glass substrate 2 and the glass cover plate 1 are subject to a uniform force, which greatly reduces the occurrence of the Newton's Ring phenomenon when the vacuum pressing is performed. When the vacuum pressing is needed, after the vacuum degree meets the requirements of the glass substrate 2 and the glass cover plate 1, by continuing to be subject to the functions of the metal mask layer 5 with the hollow grooves 10 and the magnetic material layer 6, the inner surfaces of the glass substrate 2 and the glass cover plate 1 are in parallel with each other or slightly deformed but Newton's Ring phenomenon will not occur; furthermore, the hollow grooves 10 can also avoid energy absorption influences when the laser sinters the frit paste at the predetermined sintering line position A, and by absorbing the high temperature heat when laser sintering is performed, the shape and the adhering state of the frit paste can be effectively guaranteed.

Third Embodiment

Figure 8:
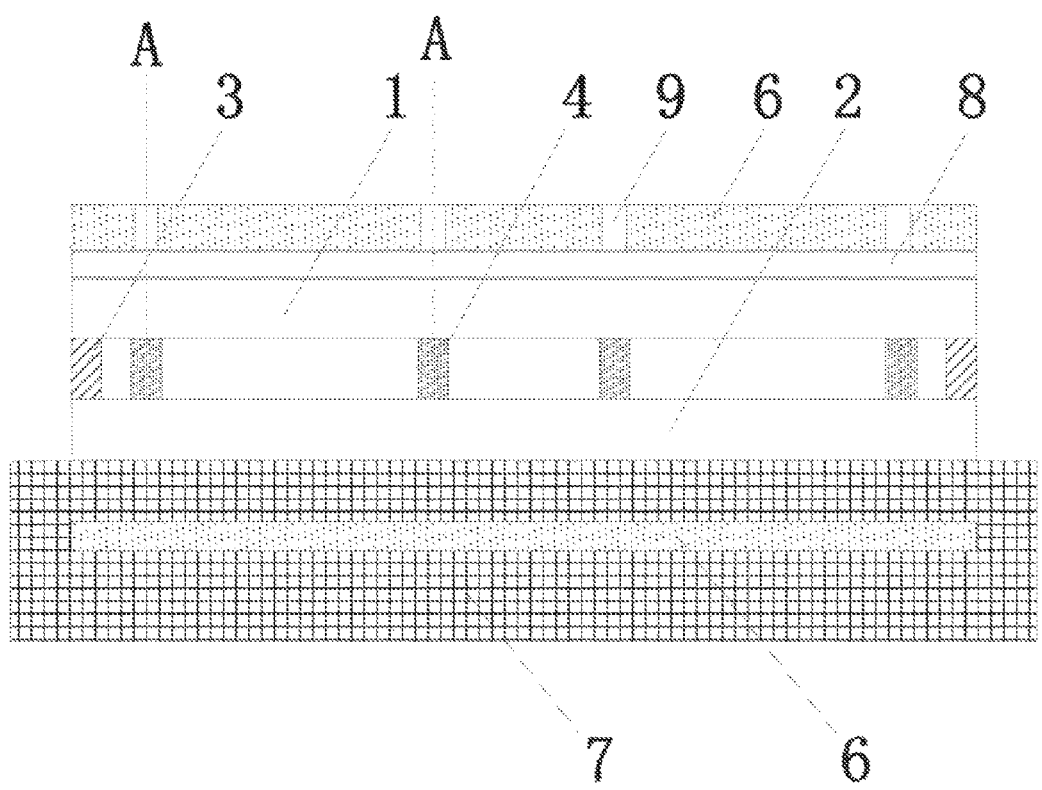
FIG. 8 illustratively shows a schematic diagram of a using state of an apparatus for packaging a display device according to a third embodiment of the present application.

FIG. 8 illustratively shows a schematic diagram of a using state of an apparatus for packaging a display device according to a third embodiment of the present application. As shown in FIG. 8, the present application provides an apparatus for packaging a display device. The display device includes a light emitting element prepared on an upper surface of a glass substrate 2. The glass substrate 2 is bonded to a glass cover plate 1 via a sealing adhesive layer. The apparatus for packaging the display device includes a laser sintering platform 7 and a magnetic mechanism. The display device is placed on the laser sintering platform 7, and a laser beam of the laser sintering platform 7 penetrates the glass cover plate 1 and focuses on the sealing adhesive layer to sinter the sealing adhesive layer. The magnetic mechanism clamps the glass cover plate 1 and the glass substrate 2 from top to bottom and applies a uniform pressing force on an effective light emitting region of the display device.

The magnetic mechanism includes two parallel magnetic material layers 6. A first magnetic material layer 6 is pressed on the glass cover plate 1, and a second magnetic material layer 6 is provided in or below the laser sintering platform 7. The two magnetic material layers 6 attract each other magnetically.

Figure 9:
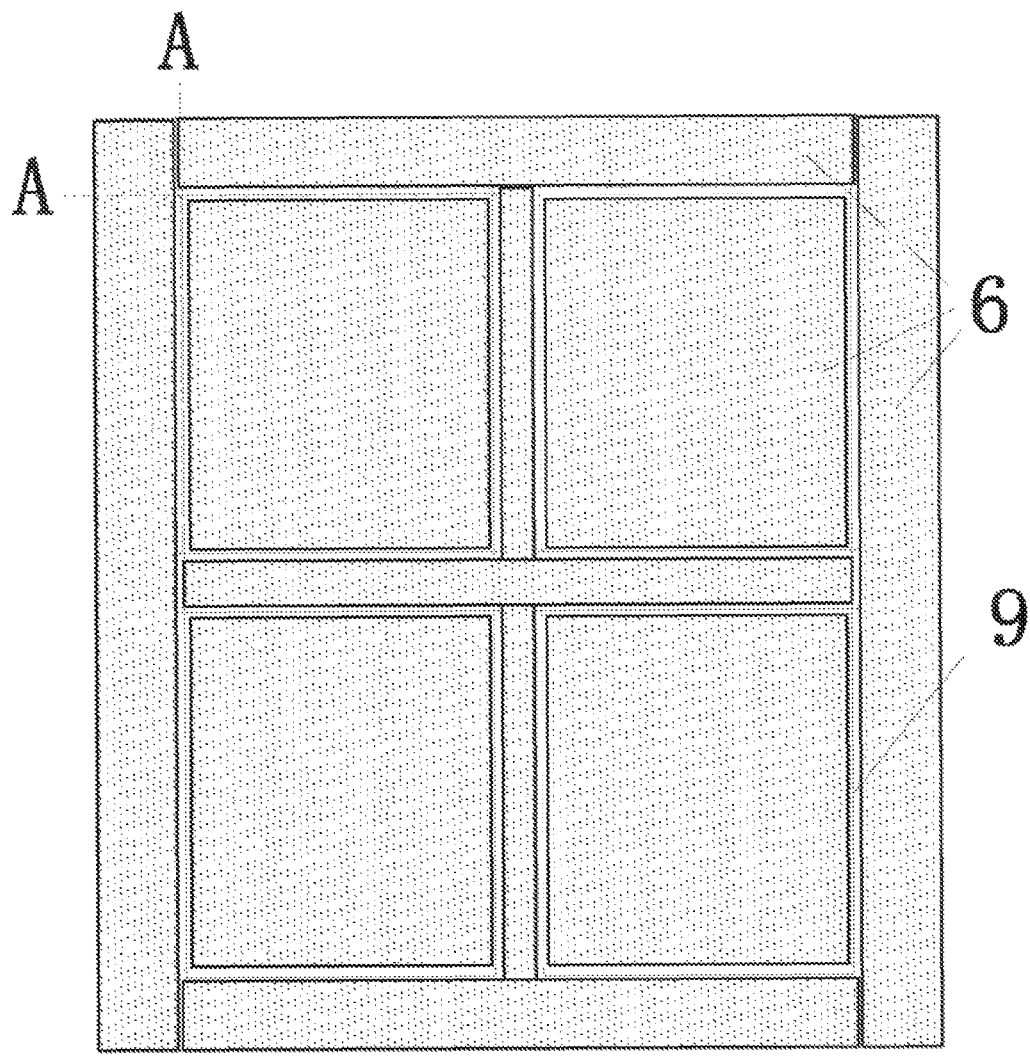
FIG. 9 illustratively shows a schematic diagram of a top view of a cover plate according to the third embodiment of the present application.

FIG. 9 illustratively shows a top view of a cover plate according to a third embodiment of the present application.

As shown in FIG. 9, the first magnetic material layer 6 includes a plurality of ferromagnetic materials, and the ferromagnetic materials are pressed on respective effective light emitting regions on the display device respectively. The shape of the ferromagnetic materials may be various types, as long as the ferromagnetic materials can shield the effective light emitting regions on the display device. The magnetic material distribution in the present application may be changed according to a pattern layout, and gaps 9 between the ferromagnetic materials are distributed along the predetermined sintering line position A of the display device. The first magnetic material layer 6 is one of a sheet-shaped magnetic material, a column-shaped magnetic material and a grain-shaped magnetic material. The hollow grooves 10 can avoid energy absorption influences when the laser sinters the frit paste at the predetermined sintering line position A, and by absorbing the high temperature heat when laser sintering is performed, the shape and the adhering state of the frit paste can be effectively guaranteed.

In this embodiment, the materials of the two magnetic material layers 6 are magnetic materials. There is a buffer layer 8 provided between the magnetic material layer 6 and the glass cover plate 1. The function of the buffer layer 8 is mainly to prevent the magnetic material layer 6 from damaging a surface of the glass cover plate 1. In practical use, in view of conditions such as high heat during the packaging procedure, it is preferable to select a wear-resistant and high-temperature-resistant buffer layer so as to better protect the surface of the glass cover plate 1.

The second sealing adhesive 4 is formed between the glass substrate 2 and the glass cover plate 1 along the predetermined sintering line position A of the display device. The second sealing adhesive 4 is a frit paste. The first sealing adhesive 3 is a UV curing adhesive. The display device is an AMOLED panel, or a passive matrix organic light emitting diode panel.

Similarly, under the function of the uniform clamping force formed by the mutual attraction between the two magnetic material layers 6, during the whole laser sintering procedure, the glass substrate 2 and the glass cover plate 1 are subject to a uniform force, which greatly reduces the occurrence of the Newton's Ring phenomenon when vacuum pressing is performed. When the vacuum pressing is needed, after the vacuum degree meets the requirements of the glass substrate 2 and the glass cover plate 1, by continuing to be subject to the functions of the two magnetic material layers 6, the inner surfaces of the glass substrate 2 and the glass cover plate 1 are in parallel with each other or slightly deformed but Newton's Ring phenomenon will not occur. The arrangement of the magnetic materials in the first magnetic material layer 6 and the gaps 9 between the magnetic materials can also avoid energy absorption influences when the laser sinters the frit paste at the predetermined sintering line position A, and by absorbing the high temperature heat when laser sintering is performed, the shape and the adhering state of the frit paste can be effectively guaranteed.

As compared with the conventional technologies, when the packaging and pressing machine of the present application performs pressing, it is only needed to guarantee that the height of the UV curing adhesive after pressing is substantively the same as that of the frit paste. The present application applies an external force on the substrate and the cover plate when the laser sintering is performed to make the substrate contact tightly with the surface of the frit paste, but does not make the substrate and the surface of the frit paste contact tightly in part or completely relying on the function of the vacuum pressing force. The magnetic materials in the present application may be placed away from the surface of the glass. A mechanical lifting method or control of the electromagnetic materials may be employed to place the magnetic materials away from the surface of the glass. A wear-resistant and high-temperature-resistant buffer layer is provided between the magnetic material mask and the surface of the glass in the present application. The buffer layer in the present application may avoid the scratches on the cover plate glass by the magnetic materials and may disperse the external force uniformly, and meanwhile the tight degree that the inner surface of the glass contacts tightly with the surface of the frit paste under the magnetic function may be adjusted depending on the contact state between the inner surface of the cover plate glass and the surface of the frit paste.

To sum up, it can be seen that the method for packaging a display device and the apparatus therefor in the present application can reduce the occurrence of the Newton's Ring phenomenon when the vacuum pressing is performed, and can adjust the magnitude of a magnetic force according to an actual state of the substrate and the surface of the frit paste to reduce the influences imposed by distance problems on laser sintering, and can further reduce or completely remove the use of supporting spacers to reduce production costs and process steps and thereby to increase the yield of the display device.

The specific embodiments of the present application are described above. It shall be appreciated that, the present invention is not limited to the above particular implementations, and one of ordinary skill in this art may make various modifications or variations within the scope defined by the appended claims, which will not influence the substantive contents of the present invention.

REFERENCE SIGNS 1 glass cover plate
2 glass substrate
3 first sealing adhesive
4 second sealing adhesive
5 metal mask layer
6 magnetic material layer
7 laser sintering platform
8 buffer layer
9 gaps
10 hollow grooves
11 cover plate
12 substrate
13 UV curing adhesive
14 frit paste
15 supporting spacers
A predetermined sintering line position

What is claimed is:

1. A method for packaging a display device, at least comprising the following steps:
   providing a display device, the display device comprising a light emitting element, the light emitting element comprising at least one effective light emitting region thereon and being prepared on an upper surface of a glass substrate, the glass substrate being bonded to a glass cover plate via a sealing adhesive layer, the sealing adhesive layer comprising a first sealing adhesive and a second sealing adhesive, the first sealing adhesive being formed at a border junction between the glass substrate and, the glass cover plate, the second sealing adhesive being formed at other junctions between the glass substrate and the glass cover plate;
   providing a platform and placing the display device on the platform;
   providing a laser beam penetrating the glass cover plate and focusing on the sealing adhesive layer to sinter the sealing adhesive layer;
   wherein a magnetic mechanism is further provided to apply a uniform pressing force on the effective light emitting region of the display device, the magnetic mechanism comprises a first magnetic material layer pressed on the glass cover plate and a second magnetic material layer disposed below the glass substrate, and the first magnetic material layer comprises a plurality of permanent magnetic materials and gaps between the permanent magnetic materials are distributed along a predetermined sintering line position of the display device.

2. The method for packaging a display device according to claim 1, wherein the magnetic mechanism comprises a metal mask layer and a magnetic material layer which are in parallel with each other, the metal mask layer is pressed on the glass cover plate, the magnetic material layer is provided below the glass substrate, and the magnetic material layer and the metal mask layer attract each other magnetically, and
   a material of the magnetic material layer is one of a permanent magnetic material and an electromagnetic material.

3. The method for packaging a display device according to claim 2, wherein the metal mask layer comprises a metal mask, a plurality of hollow grooves are provided on the metal mask, and the hollow grooves are placed over a predetermined sintering line position of the display device, or
   the metal mask layer comprises a plurality of metal masks, the metal masks are pressed on respective effective light emitting regions on the display device respectively, and gaps between the metal masks are distributed along a predetermined sintering line position of the display device.

4. The method for packaging a display device according to claim 3, wherein the metal masks are ferromagnetic metal material masks.

5. The method for packaging a display device according to claim 2, further comprising providing a buffer layer between the metal mask layer and the glass cover plate.

6. The method for packaging a display device according to claim 1, wherein a plurality of hollow grooves are provided on the first magnetic material layer, and the hollow grooves are placed over a predetermined sintering line position of the display device.

7. The method for packaging a display device according to claim 1, wherein
   the first magnetic material layer is one of a sheet-shaped magnetic material, a column-shaped magnetic material and a grain-shaped magnetic material.

8. The method for packaging a display device according to claim 1, further comprising providing a buffer layer provided between the magnetic material layer and the glass cover plate.

9. The method for packaging a display device according to claim 1, wherein the second sealing adhesive is formed between the glass substrate and the glass cover plate along a predetermined sintering line position of the display device, the second sealing adhesive is a frit paste, the first sealing adhesive is an ultraviolet curing adhesive, and the display device is an active matrix organic light emitting diode panel or a passive matrix organic light emitting diode panel.

* * * * *

UNITED STATES PATENT AND TRADEMARK OFFICE
CERTIFICATE OF CORRECTION

| | | |
|---|---|---|
| PATENT NO. | : 9,508,960 B2 | Page 1 of 1 |
| APPLICATION NO. | : 13/954211 | |
| DATED | : November 29, 2016 | |
| INVENTOR(S) | : Baowei Su | |

It is certified that error appears in the above-identified patent and that said Letters Patent is hereby corrected as shown below:

On the Title Page

Please insert:
--(30) Foreign Application Priority Data
April 27, 2013 (CN) 2013 1 0153440.6--

Signed and Sealed this
Twenty-third Day of May, 2017

Michelle K. Lee
*Director of the United States Patent and Trademark Office*